United States Patent [19]

Hanley

[11] 4,385,277

[45] May 24, 1983

[54] TOPICAL NUCLEAR MAGNETIC RESONANCE SPECTROMETER AND METHOD

[75] Inventor: Peter E. Hanley, Oxfordshire, England

[73] Assignee: The Oxford Instruments Group Limited, London, England

[21] Appl. No.: 210,199

[22] Filed: Nov. 25, 1980

[30] Foreign Application Priority Data

Jan. 21, 1980 [GB] United Kingdom ................. 8001999

[51] Int. Cl.³ ............................................ G01R 33/08
[52] U.S. Cl. ..................................... 324/309; 324/319
[58] Field of Search ............... 324/300, 307, 309, 318, 324/319

[56] References Cited

U.S. PATENT DOCUMENTS

| | | | |
|---|---|---|---|
| 3,932,805 | 1/1976 | Abe et al. | 324/309 |
| 4,015,196 | 3/1977 | Moore et al. | 324/309 |
| 4,310,799 | 1/1982 | Hutchison et al. | 324/319 |
| 4,320,342 | 3/1982 | Heinzerling | 324/319 |

Primary Examiner—Michael J. Tokar
Attorney, Agent, or Firm—Pollock, Vande Sande & Priddy

[57] ABSTRACT

A nuclear magnetic resonance (NMR) spectrometer includes a magnetic field profiling apparatus for producing a resulting static homogeneous magnetic field through a controllable volume and a magnetic field in an immediately adjacent surrounding volume of magnitude varying rapidly with distance. The dimension of the volume of uniform magnetic field and the immediately adjacent volume of rapidly varying magnetic field can be controlled by adjusting the current delivered by a power supply which energizes coils included in the magnetic field profiling apparatus. The generation of homogeneous magnetic fields throughout a controllable volume allows NMR techniques to be applied to a selected region which is located entirely within an inhomogeneous body, such as a particular organ in a human body. The uniformity of the magnetic field is such as to allow chemical shift information to be recovered in an NMR spectrum, and it is significant that this result is achieved in a noninvasive technique.

37 Claims, 22 Drawing Figures

FIG. 4

| COIL NUMBER | No. OF TURNS | h0 GAUSS/AMP | h2 GAUSS/AMP | h4 GAUSS/AMP |
|---|---|---|---|---|
| 1a | +60 | 20.033 | -0.441689 | 0.005008 |
| 1b | -71 | -20.543 | 0.187441 | 0.005670 |
| 1c | +11 | 0.995 | 0.028051 | 0.000055 |
| TOTAL No.1 | 0 | 0.485 | -0.226197 | 0.010733 |
| 2a | -131 | -28.530 | -0.278066 | 0.015198 |
| 2b | +218 | 29.170 | 0.606387 | -0.005307 |
| 2c | -87 | -3.888 | -0.087482 | 0.000512 |
| TOTAL No.2 | 0 | -3.248 | 0.292538 | 0.010403 |
| 3a | +13 | 2.840 | 0.008652 | -0.000948 |
| 3b | -13 | -0.519 | -0.008746 | -0.000038 |
| TOTAL No.3 | 0 | 2.321 | -0.000094 | -0.000986 |

TOPICAL NUCLEAR MAGNETIC RESONANCE SPECTROMETER AND METHOD

FIELD OF THE INVENTION

The invention relates to NMR spectroscopy.

BACKGROUND OF THE INVENTION

NMR techniques have been applied in a variety of environments, for such purposes as well logging, flow measurement and the monitoring of intra-tissue conditions.

It is well known that when a nuclear magnetic substance, such as water, is placed in a homogeneous static field (with a magnitude $H_0$) its resonance angular frequency $W_0$ is given by the equation:

$W_0 = GH_0$, where G is the nuclear gyro magnetic ratio of a measuring substance and is a natural constant.

Application of this phenomenon to the study of homogeneous or relatively homogeneous materials is well documented in the literature. On the other hand, application of NMR technique to inhomogeneous materials, for the selective study of regions of homogeneity within the inhomogeneous material has led to the necessity of using special techniques. For example, if appropriate magnetic fields are applied to an inhomogeneous body, the resulting nuclear magnetic resonance may include contributions from the various nuclear magnetic materials within the body subjected to the measurement. This can result in masking desired signals from one region by undesired signals from other regions.

Typically, in NMR spectroscopy, material being studied is subjected to both a static magnetic field and a radio frequency field, and the result is the induction of nuclear magnetic resonance when the above-stated equation is satisfied. Thus, a particular nuclear magnetic resonance indicates the presence of selected nuclei in the sample. Typically, the static magnetic field is produced by a suitable coil carrying a steady current, and in view of the magnitude of the magnetic field required, the coil may well be super conducting coil, the radio frequency field is produced by a supplementary coil or high frequency coil, supplied with high frequency current. Resonance is detected by a further or receiver coil surrounding the sample or the supplementary coil can be time shared.

Where the sample includes complex molecules, the localized fields produced by molecular electrons have a screening effect which causes identical nuclei in different chemical or molecular environments to resonate at slightly different frequencies. This effect, known as chemical shift, is typically of the order of $10^{-4}$ to $10^{-6}$ parts of the magnetic field. Provided that the magnetic field is sufficiently constant in space and time, these shifts, although small, can be detected and measured by the use of high resolution equipment and can yield valuable information about the chemical structure of a sample.

Where, as has been mentioned above, the sample or body being studied is inhomogeneous, and it is desired to subject a particular region in the inhomogeneous body to study, some further techniques are required to attempt to isolate the nuclear magnetic resonance signal derived from the volume of the body desired, from other portions of the body which may include other nuclear magnetic materials which can mask the desired signals. The known techniques, however, include scanning or mapping in which additional coils are provided to superimpose a sequence of switched magnetic field gradients or else time dependent magnetic fields onto the static field. Damadian, for example, in U.K. patent application No. 2,039,055A discloses a CW NMR spectrometer which requires scanning in frequency or magnetic field amplitude. Inevitably, the provision of additional fields and the analysis of the resulting signals requires elaborate arrangements of considerable complexity. In addition, the presence of gradients or time varying fields causes loss of information relating to chemical shift since the very gradients themselves destroy the homogeneity necessary to a resolution of this chemical shift information.

SUMMARY OF THE INVENTION

Thus, an object of the invention is to isolate selected homogeneous regions of an inhomogeneous body for NMR study. The static magnetic field has a component which is homogeneous throughout the selected region but the same static magnetic field has homogeneity purposefully destroyed in other (especially closely adjacent) regions. This destruction of the homogeneity of the field is such as to shift any NMR signals from these "other" regions to either beyond the resolution of the detecting equipment or sufficiently far to be easily resolvable. Furthermore, of course, to maximize the induced signal the homogeneous field must be centered on the region of interest.

Essentially, the objects of the invention are achieved by ensuring that the static magnetic field is time independent and:

1. Has a homogeneous component which is centered on the region of interest;
2. Has a homogeneous component which is homogeneous to within a tolerance sufficient to preserve chemical shift effects;
3. Is arranged to exhibit steep gradients in the vicinity of the outer extent of the region of interest.

As a result, those NMR signals which are effectively received, are derived almost solely from the homogeneous region being studied, and other signals, are incapable of masking desired signals because of the steep gradients induced at the edges of the region of interest and beyond.

In general, the entire body (or a major portion thereof) being examined is subjected to a static homogeneous field (background). In general, the desired field shape is achieved by application of an additional profiling field. The profiling field should be a field which is relatively homogeneous over a region and has relatively steep gradients outside said region. One form of a suitable field is a field centered on the region of interest whose intensity varies as high order of distance form said center. In a region near said center, the field intensity is relatively small notwithstanding the high order relation, because field intensity grows initially slowly. To extend the region of relatively homogeneous field intensity a further field, of opposite sense, and with an intensity distance relation of a lower order is applied. Preferably, the two fields are of orders N and M, where $N-M=2X$, where X is an integer $\geq 1$. Thus, in accordance with a preferred arrangement the profiling field is obtained from essentially co-located sources of magnetic fields, one of which superimposes a field varying as a selected power (or order) of distance from a selected point, and a second magnetic field which varies as a higher order of power of distance from the identical point. The second field is, however, generated with a polarity opposite of that of the first field. In a controllable region both profiling field components have relatively little effect, and the main component of magnetic field is derived from the background field. At further and further distances from the selected point, however, the effect of two profiling field components increase, although their opposite polarity serves to extend the region of homogeneity. While the magnitude of the higher order field is initially less than the selected order field, its rate of increase changes more rapidly, and so outside of the region of interest the resultant field has relatively steep gradients and far from the selected point the effect of the higher order field completely dominates the field of selected order.

In a preferred embodiment of the invention, the first field varies as the second power of distance, and the second field varies as the fourth power of distance, although those skilled in the art will appreciate that fields of varying and different orders or powers with respect to distance can be employed. In order to maintain the resultant field in the region of interest as homogeneous as possible, however, it is desirable to ensure that the powers with which the fields vary as a function of distance, are either both even or both odd.

Of course, it is also within the scope of the invention to use more than two superimposed profiling magnetic fields, and three or more magnetic fields could also be employed so long as each differs from other fields in its variation of intensity with distance by powers which are even integers.

Thus, in accordance with one preferred embodiment of the invention, an NMR spectrometer for generating an NMR spectrum from a first solid region located within a larger inhomogeneous body comprises:

magnetic field generating means for generating a magnetic field including:

(a) an RF magnetic field generator, (b) first static magnetic field means generating a homogeneous static magnetic field through a volume sufficient to encompass said body in at least two dimensions thereof, (c) second static magnetic field means for generating an inhomogeneous static field comprising:

1. An innermost static homogeneous field throughout a volume sufficient to encompass the first solid region, 2. A static inhomogeneous field within a second region surrounding said innermost homogeneous field, 3. An outer static inhomogeneous field in a third region surrounding said second region with field strength varying as the Nth power of distance from the center of said homogeneous static field, where N is an integer greater than one, and NMR receiver means responsive to NMR signals induced therein for producing said NMR spectrum.

In accordance with another aspect of the invention, a magnetic coil arrangement for use with an NMR spectrometer, comprises an assembly of a plurality of coils surrounding a volume within which an inhomogeneous body may be arranged; the coil assembly is arranged to enable a sample to be placed in the magnetic field produced in the volume when current flows through the coil assembly, and current supply means for the coils of the assembly, the coils assembly arranged and the relative magnitudes of current supplied thereto selected such that a predetermined or selected region within the volume has a substantially single valued magnetic field but the magnetic field in the remainder of the volume, and especially the field in the vicinity of the extremities of the selected region has values which are appreciably different from the said single value.

In more detail, the coil assembly is arranged to provide a first component of a static magnetic field which has a gradient varying proportionally to a high order or power of distance from a center point of the selected region. Preferably, the high order power is even and the coil assembly is arranged to provide in addition, a second magnetic field component, opposite in sense, to the aforesaid magnetic field component and having a gradient which varies at a lower, even order power of distance from the said point. The power supply energizing the coils is arranged to supply relative currents to the different coils so as to ensure that the two different magnetic field components have magnitudes which are substantially equal and opposite over a controlled region around the said point. Thus, the resulting magnetic field around the said point, and substantially encompassing the region of interest is substantially zero, but outside the region the higher order magnetic field of the two predominates. The coils are arranged so that the region of zero field is approximately spherical in shape with the said point at its center. As a result of the foregoing, substantially the only magnetic field within the region of interest is the static homogeneous magnetic field (background), because in this region, the fields produced by the two aforementioned coils are substantially equal and opposite in magnitude. However, beginning at the outer extension of the region of interest and for a substantial distance thereafter, the higher order magnetic field first predominates the lower order field, and beyond the magnetic field intensity varies as a high order of distance. This provides a sufficient gradient so that any NMR signals generated in this undesired region are sufficiently displaced in frequency from the signals generated by the region of interest, so that relatively simple frequency discriminating circuits can be used to segregate the signals generated by the region of interest from the signals generated in other regions.

As specified above, the higher order field is conveniently a fourth order field, whereas the lower even order field is a second order field.

Furthermore, in preferred embodiments of the invention each of the aforesaid fields are generated by groups of coil pairs, each group producing a different one of the two fields. Each group of the coils includes a plurality of pairs of coils, with the coils of a pair being similar to each other and positioned about the center of the region to ensure that no net magnetic field couples out to the coil which produces the static homogeneous field. By using symmetrical coils in a pair the resulting field is of even order, if desired.

Consider, as an example, high resolution $^{31}P$ NMR spectra of biological molecules which can provide detailed information about the biochemistry in physiology of living systems. The structure, cellular environment and the rates of interconversion of some important phosphorous-containing metabolites can be examined under a range of physiological conditions in a variety of tissues and organs. This information has considerable diagnostic potential in the comparison of normal and diseased tissue.

In the conventional experimental arrangement used to obtain high resolution $^{31}P$ NMR spectra from intact organs, a radio frequency coil is designed to give a uniform radio frequency field $B_1$ across the sample in a direction perpendicular to a static homogeneous field $B_0$. The homogeneity of $B_0$ is adjusted so that any residual inhomogeneity is less than the natural line width of $^{31}P$ resonance and with this arrangement high resolution $^{31}P$ NMR signals will be received from all parts of the body which is subjected to a combination of the radio frequency and static magnetic fields.

In order to limit the volume from which this high resolution $^{31}P$ NMR signals are received, the effect of homogeneous volume of the static magnetic field $B_0$ must be reduced and centered on a region of interest.

All previous NMR studies, to our knowledge with one exception was carried out on excised or perfused organs or required some form of surgery before in situ measurements. This results from the low sensitivity of $^{31}P$ and from the lack of a suitable arrangement for spatial discrimination. The single exception is reported in *Nature,* Volume 283, pages 167-70 (1980) by Ackerman et al. The citation reports on achievemnt of two-dimensional spatial resolution by the use of "surface" radio frequency coils. This method, however, is particularly suited to the study of tissues and organs that are close to the surface of a body. In contrast, the present invention provides a method of acquiring high resolution spectra from selected localized regions within a body.

The invention does not rely upon time varying fields such as the spin imaging experiments on living systems which have used inhomogeneously broadened spectra of protons to measure spatial location and concentration of tissue water, see for example, "Nuclear Magnetic Resonance of a Biological System", *Philosophical Transactions of the Royal Society* (in Press). The difficulty with the spin imaging experiments with respect to high resolution NMR information is that that very information is deliberately washed out to avoid artifacts in the image, and spatial discrimination is achieved at the expense of spectral resolution. In the present invention, since only the static magnetic field $B_0$ is modified, using a static field gradient, to select localized regions of homogeneous fields from which high resolution spectra are obtained, the biochemical information contained in the high resolution spectrum is retained.

In accordance with the invention, the magnetic field $B(r,\theta)$ generated by a profile coil system with azimuthal symmetry can be described in the terms of a Taylor expansion about the origin, $$B(r,\theta) = \sum_{n=0} \beta_n r^n P_n(\cos\theta) \qquad (1)$$

where $B(r,\theta)$ is the magnetic field at $(r,\theta)$; $P_n(\cos\theta)$ are the Legendre polynominals of order n and the field derivatives, $\beta_n$ are defined by the coil geometry and the DC current flowing through the coil system. The magnetic field $B(r,\theta)$ contains field gradients of order n, the proportions of which can be controlled using a multichannel, constant current power supply. A sensitive volume of homogeneous field can be delineated, centered on the origin and surrounded by inhomogeneous field gradients. The extent of the sensitive volume or region of interest is selected via the constant current power supply.

The parameters of the profile coil system to achieve this result are determined by the homogeneity of $B_0$, the natural line width of a nuclear species under investigation and the bore of the magnet.

Another aspect of the invention comprises a method of effecting high resolution NMR spectroscopy on selected regions (centered at a point s) of inhomogeneous samples, of sufficient resolution to detect chemical shift information on the order of $10^{-4}$ to $10^{-6}$ or smaller parts of the background field. In accordance with this aspect of the invention, typical radio frequency and homogeneous (background) magnetic fields are applied to the sample. To localize the experiment the sample is subjected to static profiling fields comprising at least two oppositely directed fields, each centered on s, each having an intensity-distance relation which is proportional to non-unity powers of distance. The order of the two fields are both even or odd and both the fields have null magnitude at said point s. The sum of the fields and the background field has a variation throughout said selected region $\leq \delta B$, wherein $\delta B$ is the natural equivalent linewidth of the desired spectrum; $\gamma \delta F$, where $\gamma$ is the gyromagnetic ratio and $\delta F$ is the linewidth of the desired resonance.

The desired profiling field is produced by a coil assembly which is wound on a former which is, or can be centered at the point s. The coil assembly preferably comprises three coil means, each having parameters (n, number of turns; $r_1$ and $r_2$, inner and outer winding ratios; $s_1, s_2$ distance of front and rear faces from the center point s,) selected to generate the desired profiling fields. The profiling fields are preferably second and fourth order. Each coil means comprises pairs of symmetrical coils wound or driven to provide zero net coupling. The coil means are driven by currents selected for each coil means to allow proportionate variation to proportionally enlarge or contract the selected region.

Figure 1A:
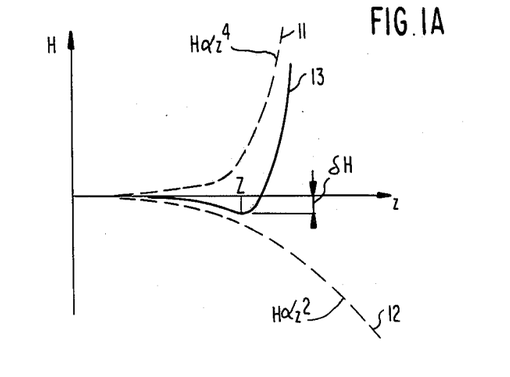
FIG. 1A illustrates second and fourth order fields, and a composite.
Figure 1B:
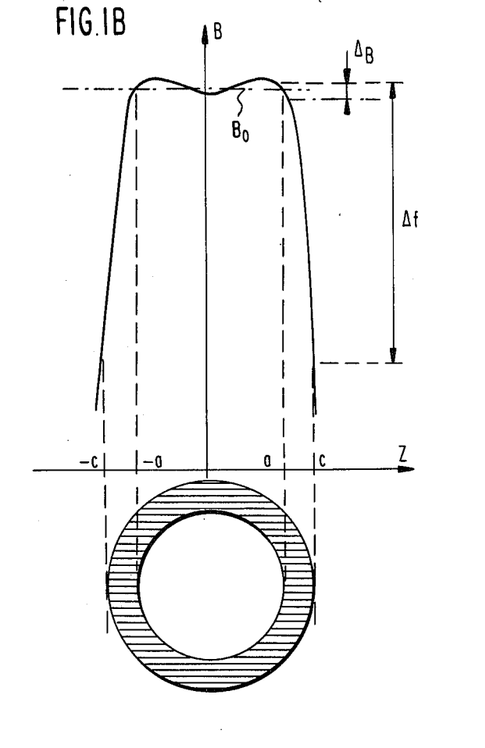
FIG. 1B illustrates total magnetic field variation with distance in a preferred embodiment.

The methods and apparatus referred to above provide for effective remote NMR measurements by producing a net magnetic field with cross section shown in FIG. 1B. Under certain circumstances it is advantageous to use a slightly different magnet arrangement to produce the identical field, i.e., one with cross section shown in FIG. 1B.

Since the profile fields, in the vicinity of the outer extent of the sensitive volume must be comparable in magnitude to the background field, the current dissipated in the profile coils can become significant and can be reduced by the following technique. In the previously described arrangement a homogeneous background field has superimposed a profile field (which itself may be a composite field) which has a substantially single valued sensitive region and is rapidly changing, as a function of distance outside that region. As an alternative, especially where large bore magnets are used for the background field, and correspondingly where large volume sensitive regions are desired, the background field has a first homogeneous component and a second component which varies with position with respect to a center of the sensitive volume such that its maximum excursion within the sensitve region is one half the desired profile field. The profile field is similar to that previously described except that now it need only supply one half the desired profile field and thus can operate at reduced current. The resultant field is substantially identical to that previously described but the power dissipated in the profile coils is reduced.

BRIEF DESCRIPTION OF THE DRAWINGS

Preferred embodiments of the invention, and several experiments, will be described in connection with the attached drawings in which like reference characters identify identical apparatus, and in which:

FIGS. 10-12 are spectra produced in testing an embodiment of the invention.

DETAILED DESCRIPTION OF THE PREFERRED EMBODIMENT

FIG. 1A illustrates the manner in which several magnetic fields, and a resulting field varies with respect to distance from an origin along the z axis. For a magnetic field which varies proportional to a high given order (or power) of z, curve 11 illustrates the general relationship between H (or B) and z for such a field. For example, curve 11 is drawn to show a magnetic field which varies as the fourth power of distance, that is, the intensity of the magnetic field is proportional to $z^4$. A brief review of the curve will show that the field is of extremely small intensity for a finite distance from the origin, but outside this region has an intensity which changes extremely rapidly with distance. Thus, there is a small region around the origin where the magnetic field is substantially single valued and in fact, substantially zero (to within $\delta B$) but outside this region the magnetic field is markedly different in its value. The region of substantially single valued field can be enlarged by providing a second magnetic field of opposite polarity to the field shown by the curve 11 and which varies as a lower even order power of the distance z. Curve 12 in FIG. 1A shows such a field which is drawn to illustrate a variation of intensity proportional to the square of the distance from the origin, that is to say, proportional to $z^2$.

The resultant field due to the two oppositely directed fields is merely the sum of these fields and has a profile as shown by curve 13, which does not depart from zero by an amount greater than $\delta B$, through a fixed distance along the z axis. This value of $\delta B$ is reached when $z=Z$. For values of z, greater than Z, the field 13 has a rapidly increasing intensity since the resultant field is predominantly due to the fourth order field, i.e., of curve 11.

By superimposing a field $B_0$ which is entirely homogeneous upon the resultant field of FIG. 1A, a field profile such as that shown in FIG. 1B results. Within the region of interest about the origin (from $-a$ to $+a$) the combined field is homogeneous (to within $\delta B$), outside the region of interest the combined field illustrates steep gradients. More particularly, at very small distances from the origin both second and fourth order fields are negligibly small. As distance from the origin grows, the second order field exceeds the fourth order field and the resultant field achieves a zero slope at a point where the rates of increase of second and fourth order fields are equal. Beyond this distance the rate of increase of the fourth order field increases more rapidly than the second order field. At still a further distance from the origin the net fields are again zero. Beyond this point the fourth order field is, and remains larger than the second order field, and at some further distance Z the net profile field achieves its highest magnitude of $\delta B$. Beyond this distance the net field continues to grow in magnitude, at some further point the second order field has a negligible contribution and the field has a substantially fourth power relationship with distance. If such a field is applied, along with the radio frequency field, to a substnace whose natural gyromagnetic ratio is defined by the frequency of the radio frequency field and the magnetic field $B_0$, an NMR signal will be induced, and if the receiving equipment has a bandwidth defined by $\Delta F$, then the signal will have two components, a first component derived from the region of interest (from $+a$ to $-a$) in which the static field is homogeneous to within $\delta B$ (which is selected to be less than the natural line of the desired resonance) plus a contribution from the inhomogeneously broadened induced signal from the region between $-a$ and $-c$, and the region between $+a$ and $+c$. Outside this region, i.e., beyond $+c$ and $-c$ no effective signal is received, because the signal induced lies outside the bandwidth of receiving equipment.

Accordingly, the objects of the invention are achieved by providing a profile coil assembly to produce a magnetic field whose intensity varies as the curve 13 in FIG. 1A. Such a profile coil assembly is one which generates a magnetic field in an approximately spherical volume of radius R, which does not include the coil, and which, therefore, contains no electric current. It can be shown that such a field can be described by equation (1).

If we select a magnetic field containing only components which very oppositely as second and fourth orders of distance, all of the terms of equation 1 on the right hand side are zero except for the coefficients of $\beta_2$ and $\beta_4$.

If now we set $$\beta_2 = 2\delta B(R/Z)^2 \tag{2}$$

$$\text{and } \beta_4 = -\delta B(R/Z)^4 \tag{3}$$

where $\delta B$ is the maximum allowed field excursion and is arranged to be less than $\delta F/G$, where $\delta F$ is the half line width of the narrowest spectral line and G is the gyromagnetic ratio, then Z, which is where the magnetic field differs from $B_o$ by $\delta B$, is given by $Z = R(-\beta_2/2\beta_4)^{\frac{1}{2}}$. (4)

Such an arrangement of coils having the values of coefficient $\beta_2$ and $\beta_4$ as set out above produce a magnetic field B which varies not only along the z axis, but also in all directions from the center. Away from the z axis the field excursion $\delta B$ occurs at some value of distance other than Z so the region of a single valued field is not exactly spherical. However, the departure is not significant so that Z can be regarded as a measure of the size of the region of single value magnetic field.

More precisely, assuming the presence of fourth and second order fields, field intensity is given by $$B = \beta_2 r^2 P_2(\cos\theta) + \beta_4 r^4 P_4(\cos\theta)$$

where $$P_2(\cos\theta) = \tfrac{1}{2}(3\cos^2\theta - 1)$$

$$P_4(\cos\theta) = \tfrac{1}{8}(35\cos^4 - 30\cos^2\theta + 3)$$

With these expressions the off axis field intensity can be calculated at $r=Z$. Plotting this as a function of $\theta$ will reveal an eight lobed, closed, generally circular pattern. The extent that the maxima or minima depart from a true circle depends on the ratio of $\beta_2/\beta_4$.

Figure 2:
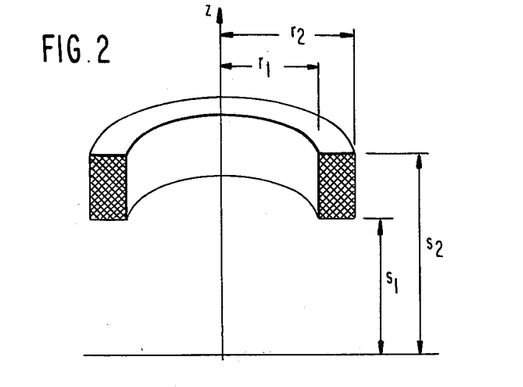
FIG. 2 illustrates a typical coil or groups of coils and identifies several relevant coil parameters for one embodiment, FIGS. 3 and 4 define the parameters of one preferred embodiment of profile coils in accordance with the invention.

If the total spectral width of the receiver which receives signals from the sample is W then a field excursion $\Delta B$ can be defined such that $\Delta B = W/G$. Only those parts of the body in which the field excursion is less than $\Delta B$ will contribute to the received signal. If $\Delta B = K \delta B$ then the radius of the volume contributing broadline signal is $Z = [1+(K)^{\frac{1}{2}}]^{\frac{1}{2}}$. FIG. 2 illustrates an exemplary coil which is cylindrical and wound around the axis z, with inner radius $r_1$ and outer radius $r_2$. Its ends lie at distances $s_1$ and $s_2$ from an origin 0 living on the z axis. For a number of turns n and current I the field B at the origin is given by:

$$B = \frac{NIr_1}{2(r_2 - r_1)(s_2 - s_1)} [F(\gamma, B_2) - F(\gamma, B_1)] \text{ where} \quad (5)$$

$$F(\gamma, B) = B \ln \left[ \frac{\gamma + (\gamma^2 + B^2)^{\frac{1}{2}}}{1 + (1 + B^2)^{\frac{1}{2}}} \right] \quad (6)$$

and $\gamma = r_2/r_1$, $B_1 = s_1/r_1$, $B_2 = s_2/r_1$; $B_1$ or $B_2$ being substituted in equation 6 as called for by equation 5.

The field $B_z$ at a point z along the axis is therefore:

$$B_z = \frac{NIr_1}{2(r_2 - r_1)(s_2 - s_1)} \left[ F\frac{(\delta, s_2 + z)}{r_1} + F\frac{(\delta, s_2 - z)}{r_1} - F\left(\delta, \frac{s_1 + z}{r_1}\right) - F\left(\delta, \frac{s_2 - z}{1}\right) \right] \quad (7)$$

Equation 1 can be represented by a Taylor expansion.

$$B_{(z,o,o)} = \sum_{n=0}^{n=\infty} \frac{z^n}{n!} \left.\frac{\partial^n B}{\partial Z^n}\right|_{z=0} \quad (8)$$

where n is a series of integers.

By relating equation 1 to equation 8 we can write:

$$B_n = \frac{R^n}{n+1} \left.\frac{\partial^n B}{\partial Z^n}\right|_{z=0} \quad (9)$$

The requisite values of $$\frac{\partial^n B}{\partial z^n}$$

can be obtained by repeated differentiation of equation 7 and these values are substituted into equation 9 for each value of n that is required to give the corresponding value of $\beta_n$.

The magnetic field coil arrangement which gives a magnetic field profile as defined by the curve 13 of FIG. 1A has no components of a magnetic field which are proportional to odd powers of z. A pair of coils which are symmetrical about an origin $z=0$ fulfills this requirement. Furthermore, since $\beta_n$ is proportional to $1/r^{n+1}$, where r is the winding radius of the coil arrangement, field gradients proportional to high order values of z can be made insignificant by winding the coil with sufficiently large radius. With these constraints the only field coefficient of significance in any pair of coils are $\beta_0$, $\beta_2$, and $\beta_4$. These terms can be found from equation 9 for $n=0$, 2, and 4.

As result, it will be noted that $\beta_n$ for any given coil is a field coefficient expressed in terms of current I, turns N, inner and outer radii $r_1$ and $r_2$ and the distances $s_1$ and $s_2$ of the end faces from the origin. For any coil a series of coil coefficients $h_n$ can be defined equal to $\beta_n/I$ and $h_n$ is independent of current and depends solely on the other parameters and is therefore, determined solely by coil geometry and location. Thus, for any coil of given geometry and location a series of coil coefficients for that coil can be calculated. In calculating the coil coefficients of a coil the quantity R can be assumed to have unit value.

With these constraints, namely a pair of symmetrical coils and a large winding radius, then following equation 1 the magnetic field B produced by such a pair of coils when carrying a current I is:

$$B = I[h_0 + h_2(z/R)^2 + h_4(z/R)^4] \quad (10)$$

where $h_0$, $h_2$ and $h_4$ are coil coefficients calculated as explained and R is given a unit value. To determine the minimum number of separate coils making up the coil assembly which are required so that the desired magnetic field profile is obtained it should be recalled that three conditions must be fulfilled, i.e., $\beta_o = 0$, and equations 2 and 3 should be satisfied. The first of these conditions ensures that the coil assembly provides a zero valued magnetic field in the selected region. The remaining conditions provide for opposing second and fourth order gradients. Fulfillment of all these three conditions simultaneously requires a minimum of three coils each carrying different values of current $I_1$, $I_2$, $I_3$, respectively. Thus, $$I_1 h_{01} + I_2 h_{02} + I_3 h_{03} = 0 \quad (11)$$

$$I_1 h_{21} + I_2 h_{22} + I_3 h_{23} = 2\delta B (R/Z)^2 \quad (12)$$

$$I_1 h_{41} + I_2 h_{42} + I_3 h_{43} = -B(R/Z)^4 \quad (13)$$

where for each h the first suffix relates to a coil coefficient and the second suffix relates to a particular coil.

It is desirable that the coils have no net coupling with the magnet coil which provides the background field. This is ensured by arranging that the total number of ampere-turns of the assembly is zero. If each coil is replaced by a group of coils carrying the same current and different coils of a group are wound in opposite sense it can be arranged that the sum of the turns of any group is zero and thus none of the individual coil groups couples to the main magnet coil.

Figure 3:
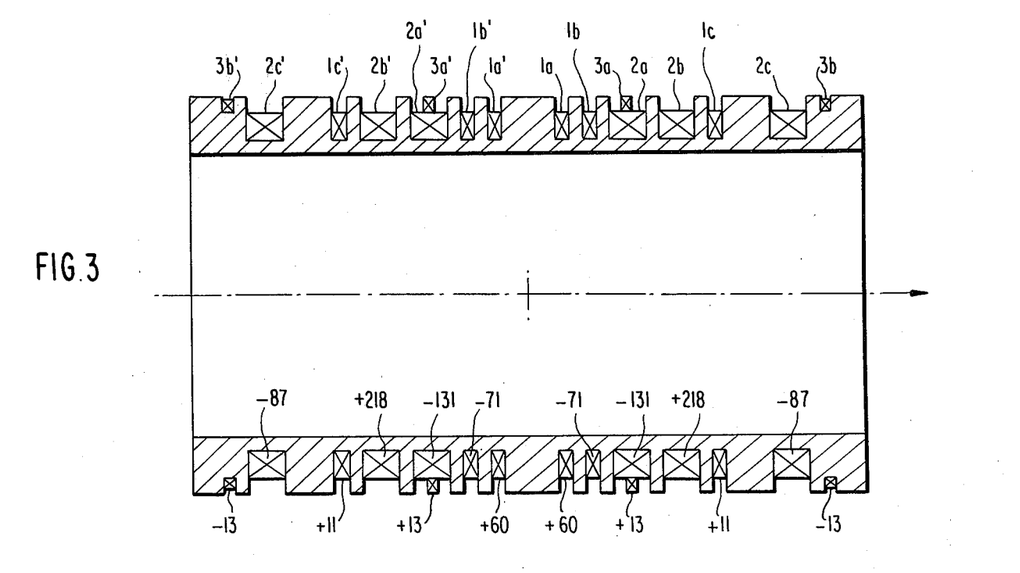

An example of a coil assembly that is constructed in accordance with the requirements set out above is illustrated in cross-section in FIG. 3. The coils are wound on a cylindrical former (cross-hatched in FIG. 3) the central axis of which corresponds to the z axis and the center of which lies at the center of the region of homogeneous magnetic field. There are three groups of coils, i.e., groups 1, 2 and 3. Each group comprises a number of pairs of coils. The coils of a pair are identical to each other and are symmetrically positioned about the center of the former. This ensures that there are no odd-order magnetic field gradients. Coil group 1 comprises three pairs of coils $1a$ and $1a'$, $1b$ and $1b'$, $1c$ and $1c'$. Coil group 2 comprises three pairs of coils $2a$ and $2a'$, $2b$ and $2b'$ and $2c$ and $2c'$. Coil group 3 comprises two pairs of coils $3a$ and $3a'$ and $3b$ and $3b'$. An example of approximate relative positions of the various coils is as laid out in FIG. 3 and an example of a suitable number of turns for each coil is indicated in the lower half of FIG. 3 at each coil position. A negative sign adjacent a turn number indicates that the coil is wound in the opposite sense to the others or is connected to carry current in the reverse direction. All the coils of a group are connected together and carry the same current $I_1$, $I_2$, or $I_3$ as the case may be.

Figure 4:
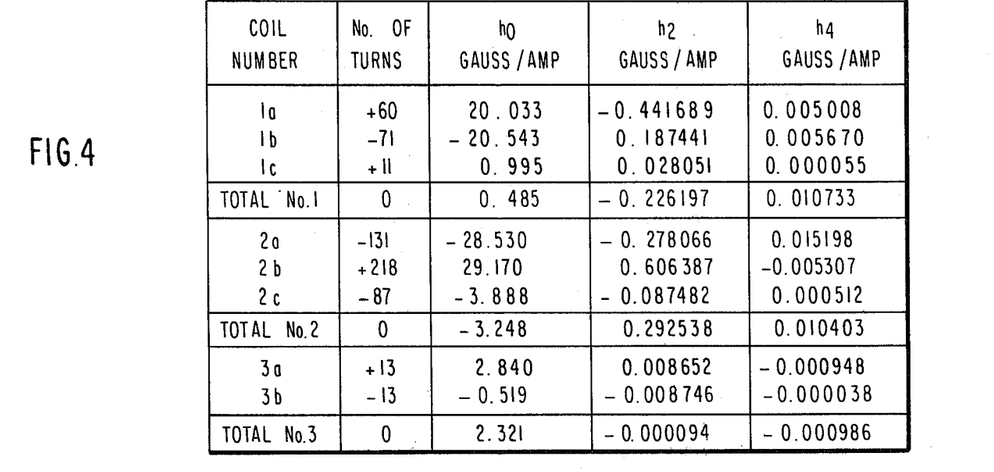

FIG. 4 is a table which list the number of turns of each coil and appropriate values for the coil coefficients $\beta_0$, $\beta_2$ and $\beta_4$ for every coil as calculated from equation 9.

To determine the values of the currents $I_1$, $I_2$ and $I_3$ equations 11, 12 and 13 are solved for these unknowns from which $$I_1 = d_1/Z^2 + e_1/Z^4 \tag{14}$$

$$I_2 = d_2/Z^2 + e_2/Z^4 \tag{15}$$

$$I_3 = d_3/Z^2 + e_3/Z^4 \tag{16}$$

where d and e with appropriate suffixes are constant.

Figure 5:
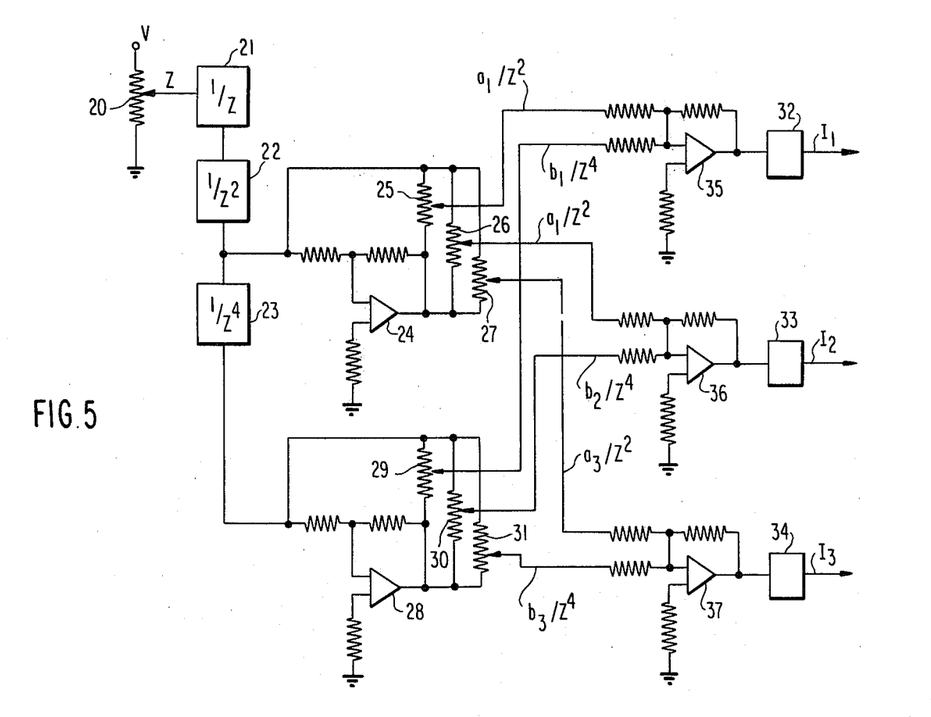
FIG. 5 is a schematic of a suitable coil power supply.

A circuit arrangement for providing the currents $I_1$, $I_2$ and $I_3$ in accordance with equations 14, 15 and 16 is illustrated in FIG. 5. Voltage V is fed to a potential divider 20 and the slider of the potential divider is set to provide an output voltage Z which is adjustable proportionally to the required size of the region under investigation. This signal is applied to an analog divider circuit 21 providing an output proportional to the reciprocal of its input, that is to say proportional to $1/Z$. The output of circuit 21 is applied to two multipliers or squaring circuits 22 and 23 in cascade. These circuits thus provide outputs proportional to $1/Z^2$ and $1/Z^4$ respectively. The output from circuit 22 is applied to an inverting amplifier 24 feeding three potential dividers 25, 26 and 27 in parallel. Similarly, the output of circuit 23 is fed to an inverting amplifier 28 feeding three potential dividers 29, 30 and 31 in parallel.

Three current generators 32, 33 and 34 provide currents $I_1$, $I_2$ and $I_3$ for the respective groups of coils. The inputs to these generators are obtained from respective summing amplifiers 35, 36 and 37. The input to summing amplifier 35 is obtained from potential dividers 25 and 29. The input to summing amplifier 36 is obtained from potential dividers 26 and 30. The input to summing amplifier 37 is obtained from potential dividers 27 and 31.

The sliders of the potential dividers 25, 26, 27 and 29, and 30, 31 are set respectively in accordance with the magnitudes of the coefficients $d_1$, $d_2$, $d_3$ and $e_1$, $e_2$, $e_3$. It will be seen therefore that the respective currents $I_1$, $I_2$ and $I_3$ obtained from generators 32, 33 and 34 fulfill the requirements of equations 14, 15, and 16. This circuit is only one of many which will fulfill the requirements of the invention, others will readily occur to those skilled in the art.

Although the preceding discussion has described a profiling coil assembly to produce a profile field of intensity corresponding to the composite curve 13 (of FIG. 1A) those skilled in the art will understand how a coil assembly can be derived to produce the fourth order field of curve 11 (FIG. 1A). While the field of curve 13 provides a larger region of homogeneous field than curve 11 which is preferred, the field of curve 11 can provide the necessary steep gradients to localize a particular region, and thus is within the scope of the invention.

The choice of magnetic field amplitude for an NMR experiment is determined by sensitivity (which increases the field intensity) and desired spectral resolution. These parameters fix a lower limit. An upper limit is fixed by economics and engineering difficulty since higher limits may require longer coils and higher power. Typical field strength varies from 500 Gauss for proton NMR when high resolution is not required, from 10,000 Gauss with less sensitive nuclei for high resolution to 120,000 Gauss for small magnets and 20,000 Gauss for large magnets.

As mentioned above the background field may include a homogeneous component and a distance varying component when it is desirable to reduce the current requirements of the associated profile coil assembly. This is advantageous especially where the background field is generated with superconducting technology. In this case the background field's distance varying component can vary as a high order of distance from the center of the sensitive volume. This variation can be identical to that of an associated profile coil, i.e., fourth order or oppositely polarized second and fourth order, or some other combination which results in the desired profile. The profile coils is as described above except that it now need only provide half the non-homogeneous field previously required. In fact, the coil coefficients can be identical and the current halved to achieve the identical field shown in FIG. 1B.

Figure 6:
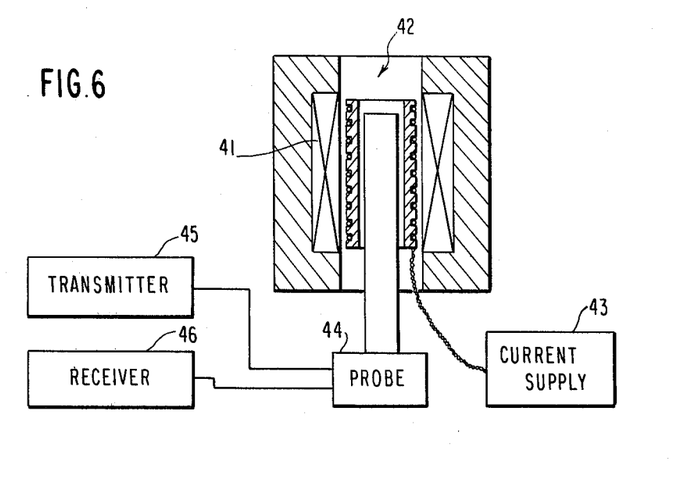
FIG. 6 is a general view of a NMR spectrometer in accordance with the invention.

An NMR spectrometer which includes a magnet coil arrangement as described above with reference to FIG. 3 and FIG. 5 is generally illustrated in FIG. 6. As shown therein the spectrometer comprises a magnet coil 41 which provides a constant magnetic field (background) within a central bore. Coil 41, which may be superconducting (alternatively can be air cored resistive coil, iron cored electromagnet or permanent magnet) provides a field which is sufficiently steady, both in space and time, to enable high-resolution spectroscopy to be undertaken. Within the bore a profile coil assembly 42 such as that shown in FIG. 3 is positioned which modifies the value of the magnetic field within the bore everywhere except in a selectable region located centrally of coil assembly 42. The background field and profile field are both static and their sum is homogeneous to less than the line-width of the desired resonance within said selectable region. Electric currents to the coils of coil assembly 42 are supplied from a current supply source 43 corresponding to the arrangement shown in FIG. 5. An NMR probe 44 can be inserted within the cylindrical space defined by coil assembly 42. Probe 44 contains rf transmitter and receiver coils (or only one coil, if time shared) and provision for holding a sample. A transmitter 45 provides rf signals to the probe 44 and a receiver 46 receives signals from the NMR probe 44. Receiver 46 may include a suitable computing arrangement for processing the received signals.

In use of the spectrometer a sample is positioned in probe 44 and the probe is inserted into the central space within assembly 42. The region from which effective signals are obtained in receiver 46 has its center fixed by the position of assembly 42 but its size can be varied by control of the currents supplied by current supply source 43.

The signals effectively received in receiver 46 will not be from the whole sample but only from that portion of the sample which lies in a small region centered on the center point of coil assembly 42. The size of this region can be adjusted by adjustment of potentiometer 20 forming part of the current supply means 43. To examine a different part of the sample the sample or the coil assembly 42 is moved.

Figure 7:
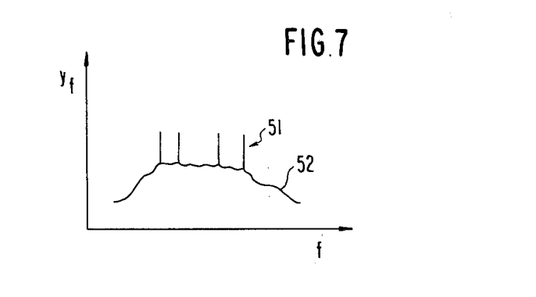
FIGS. 7 and 8 show typical output signals of a preferred embodiment.

The signals received in receiver 46 will include information from which high-resolution spectra can be obtained from the selected region within a larger volume. In addition, signals will be obtained from the fringes of the region where the departure of the magnetic field from its steady value is greater than $\delta B$ but less than $\Delta B$. Depending on the mode in which the spectrometer is used this fringe region will degrade the received signals but this degradation can be compensated for.

Where the spectrometer is operated in a continuous wave (CW) mode the spectra obtained will have a form shown in FIG. 7 and comprise high-resolution signals 51 superimposed on a broad line signal 52. A suitable function $y_f$ can be subtracted from the total signal to compensate for the broad line signal. $y_f$ has the form $$y_f = A/(1+(Bf)^2) \quad (16)$$

where f is the frequency and A and B are parameters which are empirically determined so as to give a flat base line.

Figure 8:
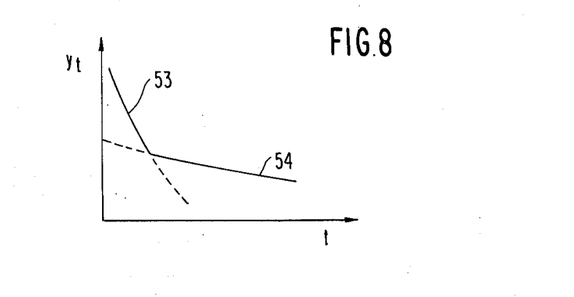

When the spectrometer is operated in a pulsed mode to provide a free induction decay (FID) signal which is Fourier transformed, the FID signal from a resonant nucleus of line width $1/r$ has an envelope of magnitude $y_t$ given by $y_t = \exp(-t/r)$. The FID signal from a broad line will therefore decay more quickly than from a narrow line and will have the general form illustrated in FIG. 8. The FID signal comprises an initial portion 53 in which there is rapid decay followed by a later portion 54 which decays more slowly and which contains the high resolution information. By delaying the accumulation of data until after the initial signal has decayed only high-resolution information is retained.

As an alternative the same method as used in connection with the CW case can be employed. Another alternative is to use convolution differencing in which the free induction decay signals are multiplied by functions C of the form $$C = \exp(t-t/T_1) - k \exp(-t/T) \quad (17)$$

where k, T1 and T2 are chosen to suppress the broad line signal. This method is described in J. Mag. Res. 11,172 (1973).

TESTS

Two experiments were carried out, one with phantom samples and another on live rats in order to test the spatial discriminating or localizing capability of the profile coil arrangement of FIG. 3.

Figure 9:
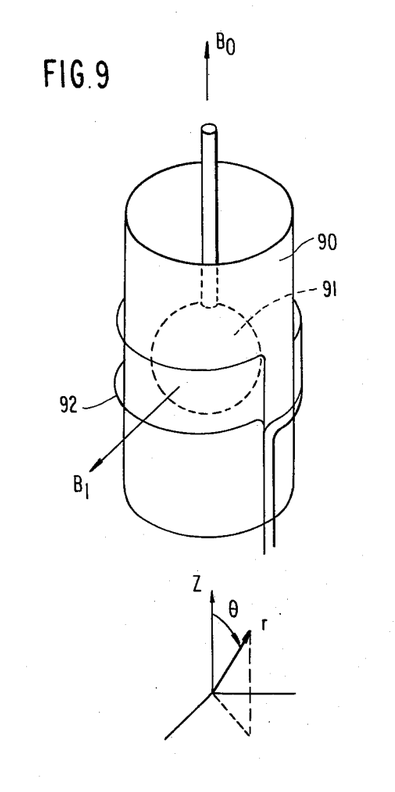
FIG. 9 is a schematic of a phantom test object used in testing.

In the first test a two-compartment test phantom, shown in FIG. 9 comprises a closed cylinder 90, 30 millimeters in diameter surrounding a closed spherical compartment 91 of 20 mm diameter. Both the compartments 90 and 91 contained adenosine triphosphate (ATP), phosphocreatine (PCr) and inorganic phosphate ($P_i$). The spherical compartment 91 contained 4.65 mM ATP 9.3 mM PCr and 3.72 mM $P_i$. The cylindrical compartment 90 contained 4.65 mM ATP, 18.6 mM PCr and 1.86 mM $P_i$. These compositions simulate the proportions of these metabolites found in heart and skeletal muscle respectively. In both compartments 90 and 91 the solutes were dissolved in 150 mM KCL to simulate the electrical conductivity of tissue. The pH in the spherical compartment 91 was adjusted to be 0.5 less than that of the outer cylindrical compartment 90. The principal effect of this pH difference is to produce a chemical shift difference between the frequencies of the $P_i$ resonances of the two samples. A single turn saddle shaped radio frequency coil 92 was used, tuned to an operating frequency of 73.8 megahertz. The spherical compartment and the radio frequency coil are mounted concentrically with the magnetic center of $B_0$ and $\beta(r)$.

Figure 10A:
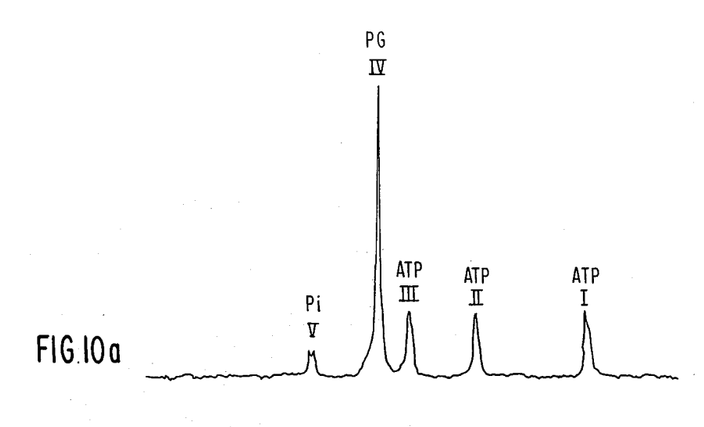

Spectra recorded from the composite samples are presented in FIG. 10a. The spectrum of FIG. 10a was obtained with the axial extent 2z, set to 40 millimeters (by adjusting the potential of the voltage divider) in 300 scans, a 6 Hz line broadening exponential multiplication was used to enhance S/N. The three ATP peaks and the PCr peak are unaffected by the difference in pH, whereas two clearly distinguishable $P_i$ peaks can be seen. Using the PCr peak as a reference, the positions of the two $P_i$ peaks from the internal and external compartments are 4.85 ppm and 5.23 ppm, corresponding to pH values of 7.10 and 7.45 respectively. The $P_i$ concentration in the internal sample is twice that in the external sample, but since the ratio of internal to external compartment volumes is 0.2 the internal $P_i$ peak area should be 0.84 that of the external $P_i$ peak area. The value of the $P_i$ concentration ratio measured in the peak area is in good agreement with the expected value.

Figure 10B:
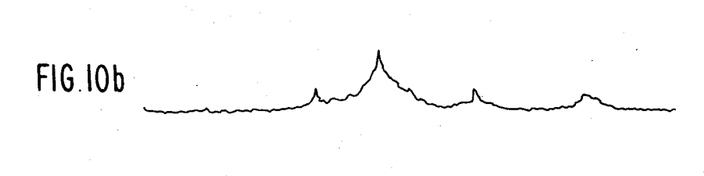
Figure 10C:
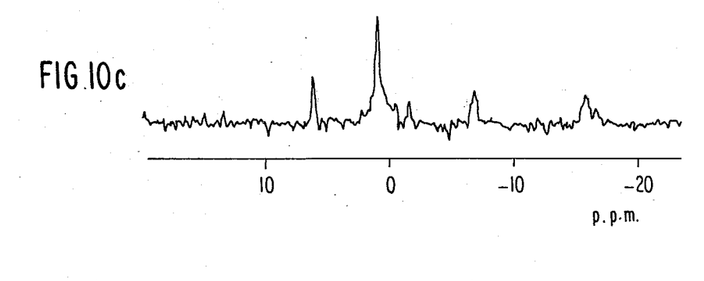

The power supply was then adjusted so that the axial extent 2a was reduced to 20 millimeters and the spectrum recorded as shown in FIG. 10b and obtained in 600 scans with the same S/N enhancement. The broad component at the base of each peak is derived from the metabolites in the external compartment which now lie in a region of inhomogeneous magnetic field. This broad signal can be eliminated using convolution difference techniques described in the Journal of Magnetic Resonance, supra, and the ensuing spectrum is presented in FIG. 10c which was obtained by 6 Hz and 60 Hz line broadenings with the vertical scale multiplied by four. The narrow peaks correspond to the metabolites present only in the spherical compartment 91 and the position of the $P_i$ peak in spectrum is 4.85 ppm in agreement with the position measured previously.

This experiment appeared to demonstrate the capability of the apparatus to acquire high resolution spectra from selected spatial location in an otherwise inhomogeneous body simulated by the two compartment test phantom. Further experiments have demonstrated a difference of 0.15 pH can be resolved and that the spectrum derived from an internal volume is almost identical to the spectrum that would be derived from the sample alone in the absence of other inhomogeneously broadened spectra.

A second test, on a live animal employed a rat, the most readily identifiable organ being the liver. This choice was made for the reason that:

a 150 gram rat fits conveniently within the radio frequency coil. The liver weighs about 5 grams and the rat can be positioned in such a way that a roughly spherical volume 1–20 mm in diameter contains liver tissue that can be localized with the profile coils.

The liver contains no detectable PCr and therefore, its spectrum is easily distinguishable from that of muscle (see FIG. 11).

A spin lattice relaxation times of some of the $^{31}$p resonances from liver are an order of magnitude shorter than those normally measured in other tissues and organs: this feature offers an additional means of identification.

The anesthesized animal was mounted vertically in a cradle, and on the basis of preliminary anatomical examination was positioned so that the liver was centralized in the radio frequency coil.

The spectrum obtained from the rat in the absence of any localizing field is presented in FIG. 11a with 128 90° pulses applied at intervals of 2 seconds. The ATP and PCr peaks are readily identifiable, but the $P_i$ and the sugar phosphate regions of the spectrum is less readily assigned. The reason for this is that the 2,3-dipholsphoglycreate from blood contributes two signals at about 4.0 ppm and 6.5 ppm and the first of these overlaps with the $P_i$ signal. However, the small intensity of the signals in this region of the spectrum means that blood contributes a negligible amount to the ATP peaks, as the concentration of ATP and blood is very much less than the concentration of 2,3-diphosphoglycreate. We can therefore conclude that the ATP signals arise primarily from the liver and muscle tissue, the PCr arises exclusively from muscle, while the signals in the $P_i$ and sugar phosphate region may have contributions from liver, muscle and blood.

Following this the sensitive volume was reduced (set to 20 mm) and the resulting spectrum is shown in FIG. 11b and again with 128 90° pulses at intervals of 2 seconds. The smaller peak intensities reflect the fact that now high resolution signal is being acquired from a smaller volume. Although the spectra of FIGS. 11a and 11b were obtained with the same spectrometer conditions, there is a change in the relative proportions of the metabolite resonances, indicating an alteration in the region that contributes high resolution signals. In fact, the spectrum of FIG. 11b more closely resembles the spectrum of a perfused liver shown in FIG. 11e. However, there is still some PCr present, the origin of which will now be discussed. The spectra of FIG. 11a and 11b were obtained using a radio frequency pulse interval of 2 seconds, which is fairly typical for $^{31}$P NMR study of whole tissue. FIG. 11c shows a spectrum obtained with a pulse interval of 220 milliseconds, in the absence of localizing fields with 1024 90° pulses. The PCr peak intensity is now significantly reduced in comparison with its intensity in FIG. 11a because its spin-lattice relaxation time $T_1$, is long (about 3 seconds). The reduction in the ATP intensity is far less, partly because the ATP in tissues such as muscle has a rather shorter relaxation time (about 1 to 2 seconds), and partly because a significant percentage of the ATP is in the liver, and liver ATP has very short $T_1$ values (about 100 milliseconds). FIG. 11d shows a spectrum obtained using 1024 90° pulses at the short pulse interval with a reduced sense of the volume (2a set at 20 mm's). This spectrum contains no PCr signal and it is very similar to the spectrum of perfused liver shown in FIG. 11e. This illustrates that the signals of FIG. 11d are predominantly from the liver which has been successfully localized, without the necessity for surgery.

Figures 12A, 12B, 12C:
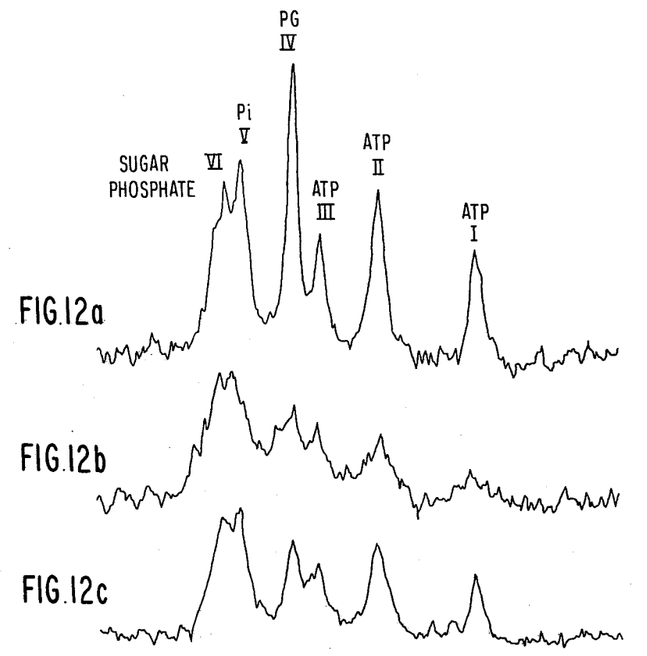
Figure 12D:
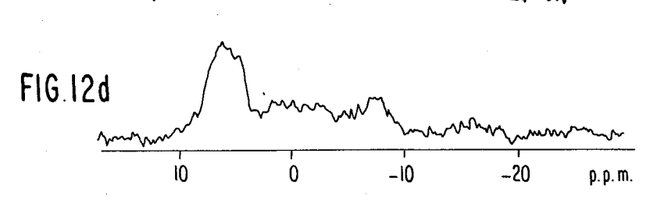

To confirm the effectiveness of this localization, the experiment was continued and the animal underwent surgery to cut off the blood supply to the liver. That is, following the experiments whose spectra is illustrated in FIG. 11, the rat was removed from the probe, and surgery performed to ligate the hepatic artery and portal vein. The animal was then repositioned in the probe and the experiments of FIG. 11 were repeated and the results are presented in FIG. 12a–12d. The various spectrum of FIG. 12a–12d were taken under conditions similar to those obtained in FIGS. 11a–11d. The marked reduction of ATP and increased levels of $P_i$, after ligation, shown in FIG. 12b and 12d, clearly indicate unhealthy liver tissue thereby verifying the origin and interpretation of the previous spectra. In contrast, the PCr signal intensity in FIG. 12a is very similar to that of FIG. 11a, since the metabolic state of the muscle is little affected by the operation. This confirms that the FIG. 12a spectrum includes muscle whereas the FIG. 12b spectrum has been localized to exclude contribution from muscle.

The foregoing description is sufficient to enable those skilled in the art to make and use the invention claimed hereinafter. In a practical implementation a digital computer is used to actually control the Rf coils and to sample, process and display the induced signals; however, inasmuch as application of such a computer is not necessary to use of the invention, and can be effected by those of ordinary skill, disclosure of this particular implementation is not required.

What is claimed is:

1. A non-invasive NMR device for deriving NMR information from a first solid region with a center c located within a larger homogeneous body comprising:
magnetic field generating means for generating a magnetic field including:
(a) an Rf magnetic field generator,
(b) first static magnetic field means for generating a first static magnetic field throughout a volume sufficient to encompass said body in at least two dimensions thereof,
(c) second static magnetic field means for generating in inhomogeneous second static field defined within a volume of generally smaller dimension than said volume, and encompassed therein, said inhomogeneous static field comprising:
an innermost static field throughout a volume sufficient to encompass the first solid region, and
an outer static homogeneous field encompassing said innermost homogeneous field said outer field strength varying as Nth order of distance from said center c wherein superposition of said first and second static magnetic field results in a homogenous static magnetic field centered on said point c, N is an integer greater than unity, and
(d) NMR receiver means responsive to NMR signals induced therein for producing said NMR spectrum.

2. The apparatus of claim 1 wherein said first static magnetic field means generates a homogeneous magnetic field, and wherein said second static magnetic field means generates an innermost static homogeneous field, homogeneous to a predetermined tolerance.

3. The apparatus of claim 1 wherein said first static magnetic field means generates a first homogeneous field and second inhomogeneous field of intensity varying as a high order of distance from said center c, and said second static magnetic field means generates an inhomogeneous field which is homogeneous to within a predetermined tolerance in said first solid region and which varies in intensity in a manner similar to said second inhomogeneous field.

4. The apparatus of any of claims 1-3 in which said second static magnetic field means generates a static inhomogeneous field in a second region surrounding said innermost field and interior of said outer field.

5. The apparatus of any of claims 1-3 wherein said first static magnetic field means comprises a superconducting solenoid.

6. The apparatus of claim 4 in which said second static magnetic field means comprises:
a coil assembly of at least two groups of coil means, and
a multichannel power supply coupled to said coil assembly, with a number of channels equal to the number of said groups of coils, for separately energizing each said group of coils with currents of different, but related magnitudes.

7. The apparatus of claim 6 in which said coil assembly generates a composite magnetic field with one component of amplitude varying as a power N of distance from said point c and a second component with amplitude varying as a power M of distance from said point c, wherein $N-M=2x$, where x is an integer greater than or equal to 1.

8. The apparatus of claim 7 where $N=4$ and $M=2$.

9. The apparatus of claim 7 wherein N and M are even integers.

10. The apparatus of claim 6 wherein said multichannel power supply includes means to provide a variable current to each of said coil means, said provided variable currents having magnitudes fixed in relationship to each other.

11. The apparatus of claim 4 wherein said second magnetic field means produces a field with innermost, surrounding and outer volumes of a size related to controllable parameter.

12. The apparatus of claim 11 in which said second static field means includes a power supply and variations of said controllable parameter produce variations in output of said power supply.

13. The apparatus of claim 4 in which said second static magnetic field means comprises a plurality of solenoid coil means wound on a common former, with each of said coil means comprising plural pairs of coils,
power supply means for generating a current supply for each of said coil solenoid means, each coil of said pairs of coils wound in opposing senses to other coils of said pairs.

14. The apparatus of claim 12 in which said power supply means is a controllable power supply with each current supply varying proportionally to a controllable parameter.

15. The apparatus of claim 14 in which said plurality of solenoid coil means generates a composite magnetic field of substantially only second and fourth order and poled in opposite senses.

16. The apparatus of claim 13 in which there are three coil means, consisting of
first and second coil means each with three pairs of oppositely wound coils
and a third coil means with two pairs of oppositely wound coils.

17. A method of extracting NMR information at a distance from a selected solid region, centered on a point c, in situ within an inhomogeneous object comprising the steps of:
(a) generating a first magnetic field of sufficient extent to encompass said selected solid region, but necessarily encompassing at least adjacent regions of said inhomogeneous object,
(b) generating a profile field, centered on said point c with intensity varying as a high order of distance from said point c, wherein a super position of said first and profile fields is homogeneous to within a predetermined tolerance throughout said selected solid region,
(c) generating an Rf field of sufficient extent to encompass said selected solid region and frequency commensurate with intensity of said homogeneous field and resonance frequency of matter within said selected region, and
(d) detecting NMR signals induced from said sample as a consequence of said rf, homogeneous and profile fields.

18. The method of claim 17 wherein said first magnetic field is a homogeneous field within a volume larger than said selected solid region.

19. The method of claim 17 wherein said
first magnetic field has a homogeneous component and an inhomogeneous component which varies as at least as a high order of distance from said point c, and wherein said profile field has a variation with distance similar to the inhomogeneous component of said first magnetic field.

20. The method of claim 18 or 19 which includes a further step of:
processing said NMR signals to eliminate inhomogeneously broadened NMR signals generated exterior to said selected region.

21. The method of claim 20 which includes the further step of generating a further profile field, opposite in sense to said high order profile field and varying in intensity as a lower order of distance from said point c.

22. The method of claim 21 in which said high order profile field is of order M, and said further profile field is of order N, and $N-N=2X$, where X is an integer greater than or equal to unity.

23. The method of claim 22 in which $M=4$ and $N32 2$.

24. The method of claim 21 wherein said step of generating said profile fields comprises:
(i) providing at least three coil groups, said groups wound on a common former, and each of said groups consisting of a plurality of coil pairs,
(ii) energizing each oil in a group with a common current, selected to provide a magnetic field at said point c which is within said tolerance.

25. The method of claim 24 wherein said step (ii) comprises providing a power supply with a different output channel for each of said groups, each of said channels providing currents of magnitude fixed in relation to currents in each of said other channels.

26. The method of claim 21 which generates an NMR spectrum preserving chemical shift information of linewidth equivalent to δB wherein:
   a sum of said homogeneous and profile fields is limited to a variation of δB throughout said selected region, but said sum exhibits steep gradients with respect to distance outside said selected region.

27. The method of claim 26 wherein a ratio of δB to said homogeneous field is less than $10^{-4}$.

28. The method of claim 27 wherein said ratio is approximately $10^{-6}$.

29. A profiling coil assembly for use in NMR spectroscopy to allow localization of a homogeneous magnetic field in a selected region with center c and to destroy such homogeneity in other adjacent selected regions comprising
   a coil former,
   a plurality of coil means wound thereon for producing a magnetic field when subjected to electric current, each of said coils means comprising a group of coils with a selected number of turns n, inner radius $r_1$, outer radius $r_2$, and first and second end faces located at distances $s_1$ and $s_2$ from said center c, to produce, when energized with a selected current for each of said coil means,
   a first region of substantially zero magnetic field substantially coextensive with said selected region, with a maximum net magnetic field at any point within said selected region of δB,
   an immediately surrounding region exhibiting steep magnetic field gradients with respect to distance from c,
   and an outer region, immediately adjacent extremities of said surrounding region with magnetic field gradients varying as a power of distance from c.

30. The assembly of claim 29 wherein each said group of coils comprising a plurality of pairs of coils, each coil of a said pair located symmetrically on said former with respect to said point c, and having an identical number of turn n.

31. The assembly of claim 29 which further includes a controllable power supply with a separate channel connected to each of said coil means, each said channel supplying a current to said connected coil means of magnitude selected in relation to currents of other channels
   whereby said coil means produces said magnetic fields in said first, immediately surrounding and outer regions, respectively.

32. The assembly of claim 31 in which said controllable power supply includes means responsive to an input parameter to generate related currents on each of said channels to control the extent of said first region.

33. The apparatus of claim 29 wherein said plurality of coil means produce a magnetic field whose intensity varies as the fourth power of distance from c.

34. The apparatus of claim 29 wherein the plurality of coil means produce at least a pair of component fields, a first field, of one polarity, with intensity varying as a fourth power of distance from c, and a second field, of opposite polarity, with intensity varying as the second power of distance from c.

35. The apparatus of claim 29 wherein said plurality of coil means produce, in said outer region, magnetic field gradients varying as a fourth power of distance from c.

36. The apparatus of claim 1 in which said first solid region is of controllable size and in which said second static magnetic field means includes:
   a plurality of coils,
   power supply means for supplying power to each of said coils including control means for varying said power,
   whereby the extent of said inner most static field is controlled.

37. The method of claim 25 in which said selected solid region is of controllable size and which includes the further step of:
   selecting the currents produced by each of said channels in a fixed relation,
   whereby said superposed first and profile fields are homogeneous to within said predetermined tolerance throughout a selected solid region whose extent is related to said selected currents.

* * * * *

UNITED STATES PATENT AND TRADEMARK OFFICE
CERTIFICATE OF CORRECTION

PATENT NO. : 4,385,277
DATED : May 24, 1983
INVENTOR(S) : Peter E. Hanley

It is certified that error appears in the above—identified patent and that said Letters Patent are hereby corrected as shown below:

Claim 1, line 3 (column 16, line 41), change "homogeneous" to -inhomogeneous-.

Signed and Sealed this

Second Day of August 1983

[SEAL]

Attest:

GERALD J. MOSSINGHOFF

Attesting Officer   Commissioner of Patents and Trademarks